Figure 1:
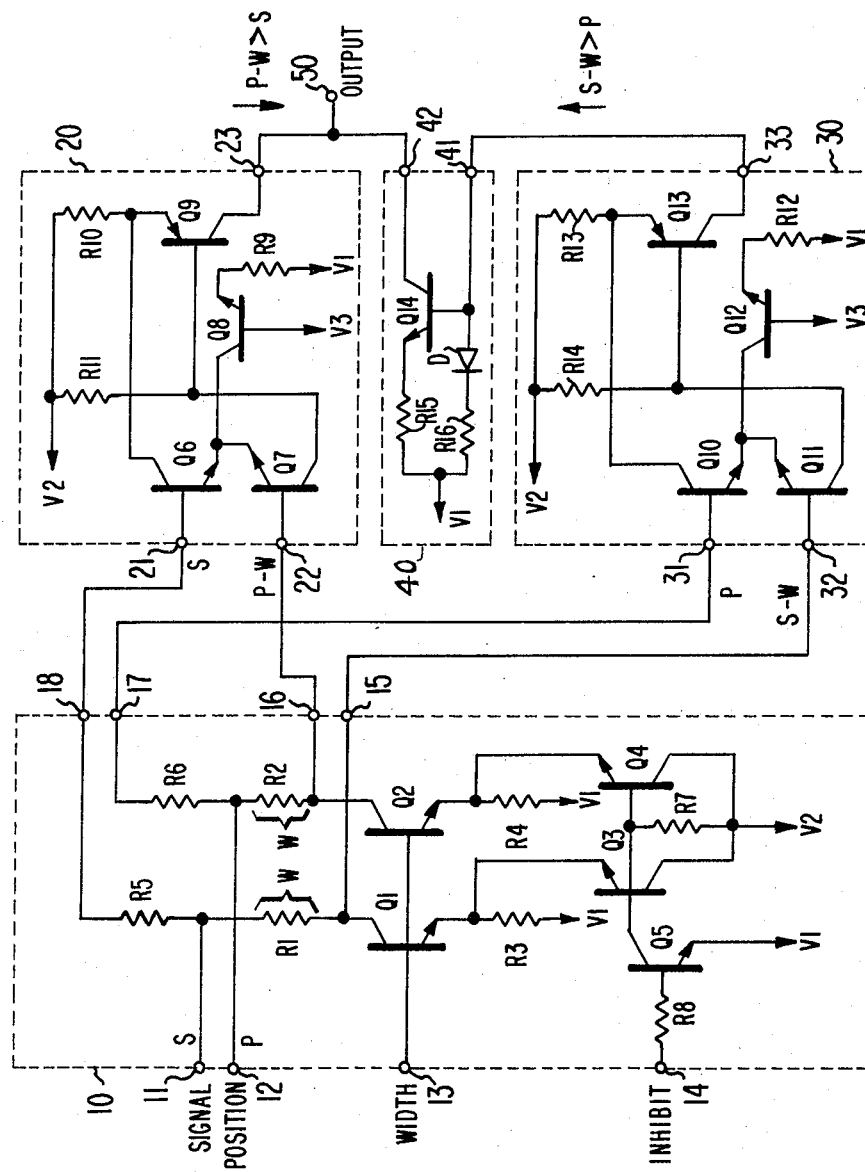

United States Patent [19]

Wilber et al.

[11] 4,277,695
[45] Jul. 7, 1981

[54] AMPLIFIER HAVING DEAD ZONE OF CONTROLLABLE WIDTH AND POSITION

[75] Inventors: James A. Wilber, Indianapolis, Ind.; Bernard J. Yorkanis, South Plainfield, N.J.

[73] Assignee: RCA Corporation, New York, N.Y.

[21] Appl. No.: 58,022

[22] Filed: Jul. 16, 1979

[51] Int. Cl.³ .......................... H03K 5/08; H03K 5/24
[52] U.S. Cl. ..................................... 307/542; 307/264; 307/355; 307/360; 328/158; 328/172
[58] Field of Search ............... 307/237, 264, 354, 355, 307/360; 328/143, 147, 158, 169, 172; 330/254, 295

[56] References Cited

U.S. PATENT DOCUMENTS 3,716,726  2/1973  Trimble ................................ 307/237
3,851,259  11/1974  Porawski ............................. 328/143

*Primary Examiner*—John Zazworsky
*Attorney, Agent, or Firm*—Eugene M. Whitacre; Joseph S. Tripoli; Richard G. Coalter

[57] ABSTRACT

A first amplifier compares an input signal with the sum of a position control signal and a first width control signal and a second amplifier compares the position control signal with the sum of the input signal and a second width control signal, the second width control signal being derived from the same source as the first. Output circuitry combines unipolar output currents produced by the amplifiers to provide a net output current which flows in one sense to a load when the input signal is more positive than a first level and flows in the opposite sense when the input signal is more negative than a second level. No output current flows when the input signal lies within a dead zone defined by said levels, the position and width of the dead zone being separately and non-interactively controllable by said position and width signals.

10 Claims, 2 Drawing Figures

AMPLIFIER HAVING DEAD ZONE OF CONTROLLABLE WIDTH AND POSITION

This invention relates to amplifiers and particularly to amplifiers of the kind having a dead zone.

Dead zone amplifiers, sometimes referred to as "center clipper" amplifiers or "coring" amplifiers, are amplifiers which reject input signals lying within a given range (dead zone) while amplifying signals lying outside the given range. Such amplifiers are useful in diverse applications. For example, in telephone or other communication systems they are used for noise attenuation. They are also used in servo systems for preventing excessive cycling or "hunting".

U.S. Pat. No. 3,716,726, entitled "Center Clipper" which issued to D. C. Trimble on Feb. 13, 1973, discloses a dead zone detector used to operate a switch in a telephone transmission channel for attenuating noise. An advantageous feature of the known circuit is that the width of the dead zone (and thus the noise rejection region) may be controlled by a single control signal without affecting the position of the dead zone relative to the expected range of input signal variations. To do this, however, the original d.c. component of the input signal is removed by means of a capacitor and new d.c. components controlled by a common source are added to the signal by a network so as to produce two signals having differing d.c. components. One of these is then compared with a fixed reference voltage and the other is compared with a variable reference voltage which is also controlled by the current source. The outputs of the comparators are then combined by a logic gate which controls the switch in the telephone transmission channel. By changing the value of the current produced by the current source, the d.c. components of the two derived signals and the variable reference voltage all change to thereby control the dead zone width. The position of the dead zone relative to the input signal is not affected by changes in its width because of the removal of the original d.c. component of the input signal and replacement by the new d.c. components derived from the current source. This has the disadvantage of limiting the technique taught by Trimble to a.c. signal applications. It would not be well suited, for example, for applications to servo systems in which the d.c. component of the input signal plays an important role.

A dead zone amplifier which features d.c. as well as a.c. response is disclosed in U.S. Pat. No. 3,851,259 entitled "Deadzone Circuit" which issued to D. J. Porawski on Nov. 26, 1974. There a reference voltage is compared with the sum of the input signal, a first control signal and a feedback signal by a first differential amplifier. The reference voltage is also compared with the sum of the input signal, a second control signal and a feedback signal by a second differential amplifier. The outputs of the amplifiers are then combined in a diode network and applied to a third amplifier which provides the circuit output signal and the two feedback signals. The use of two control signals allows one to independently set the upper and lower limits of the dead zone range. The disadvantage is that where one wishes to maintain a given dead zone width but change its position relative to the input signal one must do it indirectly by adjustment of the two control signals. A further problem is that for certain dead-zone positions the reference voltage also may have to be changed.

The present invention is directed to meeting the need for a dead zone amplifier in which the position and the width of the dead zone are independently and non-interactively controllable and which is not limited to a.c. coupled applications.

A dead zone amplifier embodying the invention comprises an input circuit responsive to an input signal and a width control signal for providing a first composite output signal representative of the sum thereof, said input circuit also being responsive to said width control signal and a position control signal for providing a second composite output signal representative of the sum thereof. A first differential amplifier responsive to the input signal and the second composite output signal produces a first output current of a given sense when the input signal and the second composite output signal are of first relative magnitudes. A second differential amplifier responsive to the position signal and the first composite output signal produces a second output current of the given sense when the position control signal and the first composite signal are of first relative magnitudes. An output circuit subtracts one of the output currents from the other to produce a difference current for application to a load whereby the position and width of the dead zone of the amplifier are individually and non-interactively controllable in response to changes in the position and width control signals.

Figure 2:
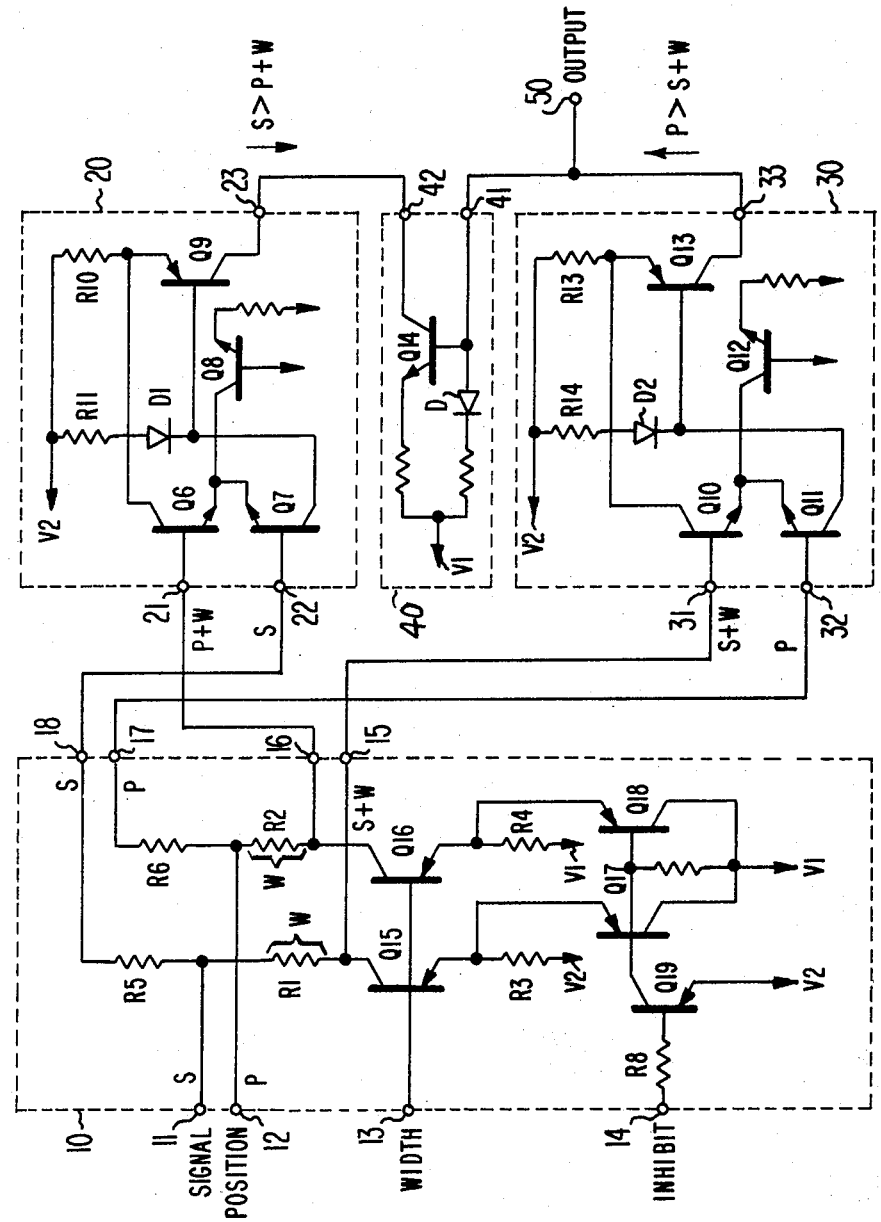

In the drawings:

FIG. 1 is a schematic diagram of a dead zone amplifier embodying the invention; and FIG. 2 is a schematic diagram illustrating modifications of the dead zone amplifier of FIG. 1.

In FIG. 1 input circuit 10 comprises a first input 11 for receiving an input signal to be amplified, a second input 12 for receiving a position control signal, a third input 13 for receiving a width control signal and a fourth input 14 for receiving an inhibit signal. Circuit 10 also includes a first output 15 for producing a first composite output signal representative of the sum of the input signal at input 11 and the width control signal at 13, a second output 16 for producing a second composite output signal representative of the sum of the position control signal applied at input 12 and the width control signal applied at input 13, a third output 17 and a fourth output 18. The latter two outputs provide equalized or compensated signals corresponding to the signals applied to inputs 12 and 11, respectively.

Input 11 is coupled to output 15 via a first summing resistor R1 and to output 18 via a first equalization or base bias current compensation resistor R5. Input 12 is coupled to output 16 via a second summing resistor R2 and to output 17 via a second equalization or base bias current compensation resistor R6. Input 13 is connected to the base electrodes of current source transistors Q1 and Q2 which are connected at the respective collector electrodes thereof to outputs 15 and 16 respectively. The emitter electrodes of Q1 and Q2 are coupled via respective current limiting resistors R3 and R4 to a first source of supply voltage $V_1$ (not shown). The emitter electrodes of transistors Q1 and Q2 are also connected to the respective emitter electrodes of emitter bias control transistors Q3 and Q4 the base electrodes of which are connected to the collector electrode of an inverter transistor Q5 and via load resistor R7 to a second supply voltage source $V_2$ which is also connected to the collector electrodes of Q3 and Q4. Transistor Q5 is connected at its base electrode to input 14 via current limiting resistor R8 and at its emitter electrode to the first supply voltage source $V_1$.

Differential amplifier 20 has a first input 21 connected to output 18 for receiving the input signal to be amplified and a second input 22 connected to output 16 for receiving the second composite output signal, and an output 23 connected to circuit output terminal 50. The first and second inputs 21 and 22 are connected to the respective base electrodes of emitter coupled transistors Q6 and Q7 the emitter electrodes of which connect to the output of a current source transistor Q8. The base of Q8 connects to a source of bias voltage $V_3$ and its emitter circuit includes a current limiting resistor R9 coupled between its emitter and the first supply voltage source $V_1$. The collector electrodes of differential amplifier transistors Q6 and Q7 are coupled to the second supply source $V_2$ via respective load resistors R10 and R11. An output transistor Q9 is connected at its collector electrode to the output 23, at its emitter electrode to the collector electrode of transistor Q6 and at its base electrode to the collector electrode of transistor Q7.

Differential amplifier 30 is substantially identical with differential amplifier 20 and comprises a first input 31 connected to output 17 of input circuit 10 for receiving the position control signal, a second input 32 connected to output 15 for receiving the first composite output signal and an output 33 for providing an output signal. Transistors Q10–Q13 and resistors R12–R14 in amplifier 30 are connected identically as the corresponding elements in amplifier 20, namely, Q6–Q9 and R9–R11.

The output 33 of amplifier 30 is connected to the input 41 of current mirror amplifier 40 the output 42 of which is connected to circuit output terminal 50. Amplifier 40 subtracts the output current of amplifier 30 from that produced by amplifier 20 thereby providing a push-pull output signal at output terminal 50.

Current mirror amplifier 40 comprises an output transistor Q14 having an emitter electrode connected to the first supply voltage source $V_1$ via a resistor R15, a collector electrode connected to output 42 and a base electrode connected to input 41. A series connection of a resistor R16 and a diode D connects the base of output transistor Q14 to the first supply voltage source $V_1$. Diode D is poled to conduct current in the same sense relative to supply source $V_1$ as the base emitter junction of transistor Q14 and provides an offset potential thereacross which compensates for variations in the base emitter junction voltage of transistor Q14 which may occur with changes in temperature.

In operation the supply voltage sources are selected such that the voltage $V_2$ is positive relative to the voltage $V_1$ and the voltage $V_3$ is of some value intermediate $V_1$ and $V_2$. The absolute values of the supply voltages $V_1$, $V_2$ and $V_3$ are not critical and may be referred to any suitable potential point. For example, $V_1$, $V_2$ and $V_3$ may all be negative provided that $V_1$ is more negative than $V_2$. Alternatively $V_1$ may be negative and $V_2$ may be positive with $V_3$ at some intermediate value. For purposes of the following discussion however, it will be assumed that the supply voltage $V_1$ is at ground potential (0 Volts) and that the supply voltage $V_2$ is of some positive potential.

Before considering the details of the overall circuit operation it is helpful first to consider briefly the objectives of the invention and how the elements described above (input circuit 10, amplifiers 20 and 30 and output circuit 40) cooperate to meet those objectives. The primary objective is to provide a dead zone amplifier which supplies output current in a given sense to a load when an input signal is above a first level and which supplies output current in the opposite sense to the load when the input signal is below a second level. The levels define a dead zone within which no output current flows in either sense to the load. To achieve this (with the advantage that the position and width of the dead zone may be independently and non-interactively controlled in response to separately applied position and width control signals) input circuit 10 is used to generate a pair of composite signals which are compared with the input signal and a position control signal by amplifiers 20 and 30. The output currents of amplifiers 20 and 30 are then subtracted by output circuit 40.

More specifically, in input circuit 10 summing resistor R1 adds an increment of voltage to the input signal proportional to the width control signal at input 13 to provide a first composite output signal at output 15. In this particular example of the invention the increment of voltage added to the input signal is added in a sense to oppose or subtract from the input signal by causing a current to flow through resistor R1 in the direction from input 11 to output 15. This function is provided by transistor Q1 in the dual output current source comprising transistors Q1, Q2 and resistors R3 and R4. Transistors Q1 and Q2 are both biased with the width control signal at terminal 13 and supply output currents at their respective collector electrodes proportional to the value of the width control signal and inversely proportional to the values of their respective emitter load resistors R3 and R4.

The collector current of transistor Q2 is applied to resistor R2 to subtract an increment of voltage proportional to the width control signal at input 13 from the position control signal at input 12 to produce the second composite output signal at output 16. As is the case with the first composite signal, the increment of voltage produced across resistor R2 is added to the position control signal in this example of the invention in a sense to oppose or subtract from the position control signal to produce the second composite signal.

Resistors R5 and R6 in input circuit 10 provide the function of equalization or base bias current compensation for transistors Q6 and Q10 in amplifiers 20 and 30 respectively. The reason resistors R5 and R6 are included in this example of the invention is that amplifiers 20 and 30 employ bipolar input transistors which necessarily require some magnitude of input bias current. Since resistors R1 and R2 are in series with the inputs of transistors Q11 and Q7 in the amplifiers for the purpose of adding the width control signal to the input signal and position control signal, they will also necessarily introduce a voltage drop proportional to the base bias current requirements of transistors Q11 and Q7. Accordingly, resistors R5 and R6 have been added in series with the base circuits of transistors Q6 and Q10 to provide an offset voltage equal to the offset voltage produced across the resistors R1 and R2. Accordingly, in the quiescent state, with a common mode signal applied simultaneously to inputs 11 and 12 and, transistors Q1 and Q2 non-conductive, the transistors Q6, Q7 Q10 and Q11 in amplifiers 20 and 30 will experience the same base voltage.

To put it another way, resistors R5 and R6 assure that transistors Q6 and Q10 are driven by source impedances of the same value as those supplying base current to transistors Q7 and Q11 so that any offset errors caused by resistors R1 and R2 due to base bias current requirements are compensated for by equal offset voltages produced across resistors R5 and R6. It will be appreciated that the equalization or base bias current compensation may be eliminated in cases where the input bias currents of amplifiers 20 and 30 are negligible (for example, where the input transistors are field-effect transistors). The equalization resistors may also be eliminated in cases where precise definition of the dead zone limits is not required.

Resistors R1–R4 in input circuit 10 control the symmetry of the dead zone with respect to the value of the position control voltage applied at input 12 as follows. The sum of the voltages produced across resistors R1 and R2 defines the width of the dead zone of the amplifier. Since the individual voltages across resistors R1 and R2 are proportional to the currents provided by the dual output current source one may obtain a symmetrical dead zone with respect to the position control signal by setting the product of the collector current of transistor Q1 multiplied by the value of resistor R1 equal to the product of the collector current of transistor Q2 multiplied by the value of resistor R2. Alternatively, the aforementioned products may be unequal for providing a dead zone which is asymmetrical with respect to the position control signal.

For the particular dual output current source shown (Q1, Q2, R3, R4) the currents through resistors R1 and R2 are inversely proportional to the values of resistors R3 and R4, therefore, if one desires a dead zone region which is symmetrical with respect to the position control signal one may set the ratio of the values of resistors R1 and R3 equal to the ratio of the values of resistors R2 and R4.

Transistors Q3–Q5 and resistors R7 and R8 comprise an inhibit circuit which when activated reduces the width of the dead zone to zero independently of the value of the width control. This is accomplished by simultaneously applying a respective turnoff voltage to a selected end of the conduction path of each of the transistors Q1 and Q2 in the dual output current source in response to an inhibit signal applied at input 14. To illustrate, assume that the supply voltage $V_2$ is positive with respect to $V_1$ and that the width control signal voltage is of some value intermediate $V_1$ and $V_2$. If the voltage of the inhibit signal at input 14 is positive with respect to $V_1$ current will flow through current limiting resistor R8 which will turn on transistor Q5 which in turn will clamp the base electrodes of transistors Q3 and Q4 to the potential $V_1$. Since the width control signal is positive with respect to $V_1$ the voltages present at emitters of Q1 and Q2 will reverse bias the base emitter-junctions of transistors Q3 and Q4 so that under this first condition the inhibit circuit will be disabled and transistors Q1 and Q2 will supply width control currents to summing resistors R1 and R2.

Assume now that the inhibit signal at input 14 changes to a value equal to $V_1$ or negative with respect to $V_1$. Under this condition transistor Q5 will be turned off and load resistor R7 will apply a voltage equal to $V_2$ to the base electrodes of transistors Q3 and Q4. This will turn transistors Q3 and Q4 on which will apply the voltage $V_2$ to the emitter electrodes of transistors Q1 and Q2 respectively. The base electrodes of transistors Q1 and Q2 however, are at the potential of the width control voltage which was assumed to be intermediate $V_1$ and $V_2$. Accordingly, the base emitter junctions of transistors Q1 and Q2 will be reverse biased thereby turning transistors Q1 and Q2 off so that no width control currents will be supplied to summing resistors R1 and R2. In this inhibited condition therefore, the first composite signal will be equal to the input signal and the second composite signal will equal the position control signal and each of these signals will be devoid of any component proportional to the width signal. Thus, the width of the dead zone will be reduced to zero.

Summarizing to this point, when the inhibit circuit is disabled the first composite signal (S−W) at output 15 of input circuit 10 equals the input signal (S) less the width control voltage (W) developed across resistor R1. The second composite signal (P−W) at output 16 equals the position control signal (P) less the width control voltage (W) developed across resistor R2. The remaining two outputs 17 and 18 of input circuit 10 provide respectively the position control signal (P) and the input signal (S). The four output signals P, S, P−W and S−W are compared in such a manner as to provide an output current which flows in first sense to a load (not shown) connected to output terminal 50 when the input signal is more positive than the sum of the position control signal and voltage W due to the width control signal (S>P+W) and which flows in a second sense to the load when the input signal is more negative than the position control signal minus the width control signal (S<P−W) and which is substantially zero otherwise.

Amplifier 20 supplies output current to output terminal 50 when the input signal is less than (more negative than) the second composite output signal (S<P−W) and produces no output current otherwise. To illustrate, assume once more that the supply voltage $V_2$ is positive with respect to the supply voltage $V_1$ and that the bias voltage $V_3$ is sufficiently positive with respect to $V_1$ so as to condition transistor Q8 to supply operating current to the emitters of transistors Q6 and Q7 inversely proportional to the value of resistor R9. Under this condition, if the input signal voltage at input 21 is more negative than the voltage of the second composite signal (P−W) at input 22, transistor Q6 will conduct a smaller collector current than transistor Q7 so that the voltage drop across load resistor R10 will be less than the voltage drop across load resistor R11. Accordingly, the base emitter junction of transistor Q9 will be forward biased thereby causing transistor Q9 to supply an output current to output terminal 50 proportional to the difference in the voltage at terminals 21 and 22. Assume now that the input signal at input 21 is more positive than the second composite signal at input 22 so that transistor Q6 conducts a greater portion of the collector current of transistor Q8 than transistor Q7. Under this condition the base emitter junction of transistor Q9 will not be forward biased and no collector current will be supplied to output terminal 50.

The only input condition remaining for consideration with regard to amplifier 20 is a condition where the input signal equals the second composite output signal. In that condition, transistor Q9 is preferably biased precisely at its threshold of conduction. One way this may be achieved is by selection of the bias current provided by transistor Q8 and the values of resistors R10 and R11 such that the product of one half of the bias current multiplied by the value of resistor R11 equals the product of one half the bias current multiplied by the value of resistor R10 plus a constant equal to the threshold of conduction of transistor Q9. In the alternative, resistor R10 and R11 may be selected to be of equal values and a diode may be connected in series with resistor R11 to accomplish a similar result. This latter approach will be subsequently described in the discussion of FIG. 2.

Amplifier 30 operates similarly to amplifier 20 but compares the position control signal (P) at input 31 with the first composite signal (S−W) at input 32 to provide output current which flows only when the first composite signal is more positive than the position control signal. The output current produced by amplifier 30 flows in the same relative sense as the output current produced by amplifier 20. To provide for push-pull application of the output currents to the load the output of amplifier 30 is connected to the input of current mirror amplifier 40 which reverses the direction of the output current with respect to the load. To illustrate, with current flowing to input 41 of current mirror amplifier 40 a voltage will be produced across diode D and resistor R16 which will forward the bias transistor Q14 to conduct a collector current proportional to the ratio of resistors R15 and R16. Assuming resistors R15 and R16 are equal value and that the junction area of diode D equals the base emitter junction area of transistor Q14 the resultant collector current of transistor Q14 will have a magnitude equal to the output current of transistor Q13 but will flow in the opposite direction to thereby withdraw current from output terminal 50 proportional to the collector current of transistor Q13.

In FIG. 2 input circuit 10 has been modified by replacement of NPN transistors Q1–Q5 with PNP transistors Q15–Q19 and the polarity of supply voltages $V_1$ and $V_2$ have been reversed. By this modification the currents provided by the dual output current source flow in summing resistors R1 and R2 in a sense to aid or add the width control signal to the input and position signals so that the first and second composite output signals become S+W and P+W respectively. Since the sign of the width control signal component of the composite signals has been changed, the connections of the outputs of input circuit 10 to the inputs of amplifiers 20 and 30 have also been changed. Specifically, amplifier 20 now receives the second composite output signal (P+W) at its first input 21 and the input signal (S) at its second input 22 and amplifier 30 receives the first composite output signal (S+W) at its first input 31 and the position control signal at its second input 32. As previously mentioned amplifier 20 has been modified to include a diode D1 in series with load resistor R11 to provide compensation for the base emitter offset potential of transistor Q9. Amplifier 30 also includes a diode D2 in series with load resistor R14 for providing compensation for the base emitter junction offset potential of transistor Q13. A final change in FIG. 2 is that the connections of the output circuit 40 have been reversed and the output terminal 50 is now connected to the output of amplifier 30.

Operation of the example of FIG. 2 is substantially the same as that of FIG. 1 previously discussed. The added diodes D1 and D2 in amplifiers 20 and 30 eliminate the need for calculations of the load resistor values for specific values of tail current applied to the input transistors. The connections of the output circuit were reversed in order to provide output current flow in the same sense to output terminal 50 as in the previous example. Input circuit 10 was modified to include PNP rather than NPN transistors to illustrate that positive incremental voltages proportional to the width control signal rather than negative incremental voltages may be added to the input signal and position control signal to produce the composite output signals S+W and P+W respectively.

As mentioned, operation of FIG. 2 is substantially the same as that of FIG. 1. In this example, amplifier 30 supplies output current to the load when the position control signal is more positive than the first composite output signal. This corresponds to the input signal S being more negative (or less positive) than P−W. Amplifier 20 supplies output current to output circuit 40 which then withdraws current from the load when the input signal S is more positive than the second composite signal P+W and produces no output current otherwise.

In both examples of the invention shown and described, it has been seen that the position of the dead zone of the amplifier is uniquely and solely controlled by one signal (the position control signal) and that the width of the dead zone is also uniquely determined by a single signal (the width control signal) and that the dead zone feature may be readily inhibited.

What is claimed is:

1. A dead zone amplifier for supplying output current in a given sense to a load when an input signal is above a first level and for supplying output current in the opposite sense to said load when said input signal is below a second level, said levels defining a dead zone within which no output current flows in either sense to said load, said dead zone amplifier comprising:
   an input circuit responsive to an input signal and a width control signal for providing a first composite output signal representative of the sum thereof, said input circuit being also responsive to said width control signal and a position control signal for providing a second composite output signal representative of the sum thereof;
   a first differential amplifier responsive to said input signal and said second composite output signal for producing a first output current of a given sense when said input signal and said second composite output signal are of first relative magnitudes, said first output current being zero otherwise;
   a second differential amplifier responsive to said position signal and said first composite output signal for producing a second output current of said given sense when said position control signal and said first composite signal are of first relative magnitudes, said second output current being zero otherwise; and
   an output circuit for subtracting one of said output currents from the other to produce a difference current for application to said load, whereby the position and width of said dead zone are independently and non-interactively controllable in response to changes in said position and width control signals.

2. A dead zone amplifier as recited in claim 1 wherein said input circuit comprises:
   a dual output current source having an input for receiving said width control signal, a first output for producing a first output current of a given sense, and a second output for producing a second output current of said given sense, said output currents being proportional to said width control signal;
   a first summing circuit responsive to said first output current for producing a first voltage proportional thereto and for adding said first voltage in a given sense to said input signal for producing said first composite output signal; and a second summing circuit responsive to said second output current for producing a second voltage proportional thereto and for adding said voltage in said given sense to said position control for producing said second composite output signal.

3. A dead zone amplifier as recited in claim 2 wherein:
said first summing circuit includes a first resistor through which said first current flows;
said second summing circuit includes a second resistor through which said second current flows; and wherein
the product of the first current multiplied by the value of the first resistor is substantially equal to the product of the second current multiplied by the value of the second resistor.

4. A dead zone amplifier as recited in claim 2 wherein said first summing circuit includes a first resistor through which said first current flows, said second summing circuit includes a second resistor through which said second current flows, and further comprising:
third and fourth resistors in said dual output current source for controlling the magnitudes of said first and second output currents, respectively, and wherein
the ratio of the magnitudes of said first and third resistors is substantially equal to the ratio of the magnitudes of said second and fourth resistors.

5. A dead zone amplifier as recited in claim 2 further comprising:
an inhibit circuit coupled to said dual output current source and responsive to an inhibit input signal for simultaneously reducing the magnitudes of said first and second output currents to substantially zero when said inhibit signal is present for reducing the width of said dead zone to substantially zero.

6. A dead zone amplifier as recited in claim 5 wherein:
said dual output current source includes first and second transistors each having a control electrode connected to said input for receiving said width control signal, and each having a conduction path, each of said conduction paths conducting a respective one of said first and second output currents; and wherein
said inhibit circuit comprises means for simultaneously applying a respective turn-off voltage to a selected end of the conduction path of each of said transistors in response to said inhibit signal.

7. A dead zone amplifier as recited in claim 2 wherein said output circuit comprises a current mirror amplifier having an input connected to an output of one of said amplifiers and an output connected to an output of the other of said amplifiers and, means for connecting said load to the output of said current mirror amplifier.

8. A dead zone amplifier as recited in claim 2 wherein each one of said differential amplifiers comprises:
an output terminal;
a pair of nodes at which antiphase output voltages are produced; and
a transistor having a control electrode coupled to one of said nodes and a conduction path coupled between the other of said nodes and said output terminal for conducting a unidirectional output current therebetween when the input signals supplied to said amplifier are of first relative values and for isolating said output terminal from said other of said nodes when the input signals supplied to said amplifier are of second relative values.

9. A dead zone amplifier as recited in claim 8 wherein said antiphase output signals of each of said differential amplifiers are produced across a pair of unequal valued load resistors, the values of said load resistors being selected such that said antiphase output signals differ in voltage by a predetermined amount when the input signals applied to the amplifier are substantially equal.

10. A dead zone amplifier as recited in claim 1 wherein said input circuit comprises:
a first input terminal for receiving said input signal;
a first output terminal for providing said first composite output signal;
a first summing resistor connected between said first input terminal and said first output terminal;
a second input terminal for receiving said position control signal;
a second output terminal for providing said second composite output signal;
a second summing resistor connected between said second input terminal and said second output terminal;
a third input terminal for receiving a width control signal;
a first transistor having a control electrode connected to said third input terminal, and having a conduction path connected at one end thereof to said first output terminal;
a third resistor connected between the other end of the conduction path of said first transistor and a point of reference potential;
a second transistor having a control electrode connected to said third input terminal and having a conduction path connected at one end thereof to said second output terminal, and
a fourth resistor connected between the other end of the conduction path of said second transistor and said point of reference potential.

* * * * *